US009496426B2

(12) United States Patent
Barnes et al.

(10) Patent No.: US 9,496,426 B2
(45) Date of Patent: Nov. 15, 2016

(54) THIN FILM PHOTOVOLTAIC DEVICES WITH A MINIMALLY CONDUCTIVE BUFFER LAYER (71) Applicant: Alliance for Sustainable Energy, LLC, Golden, CO (US)

(72) Inventors: Teresa M. Barnes, Evergreen, CO (US); James Burst, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 31 days.

(21) Appl. No.: 14/377,763

(22) PCT Filed: Feb. 5, 2013

(86) PCT No.: PCT/US2013/024743
§ 371 (c)(1),
(2) Date: Aug. 8, 2014

(87) PCT Pub. No.: WO2013/119550
PCT Pub. Date: Aug. 15, 2013

(65) Prior Publication Data
US 2015/0047699 A1    Feb. 19, 2015

Related U.S. Application Data (60) Provisional application No. 61/597,424, filed on Feb. 10, 2012.

(51) Int. Cl.
*H01L 21/00* (2006.01)
*H01L 31/0216* (2014.01)
(Continued)

(52) U.S. Cl.
CPC . *H01L 31/02167* (2013.01); *H01L 31/022466* (2013.01); *H01L 31/073* (2013.01);
(Continued)

(58) Field of Classification Search
None
See application file for complete search history.

(56) References Cited

U.S. PATENT DOCUMENTS 4,338,482 A   7/1982 Gordon
4,395,467 A   7/1983 Vossen, Jr. et al.
(Continued)

FOREIGN PATENT DOCUMENTS

CN    1010377595    9/2007
WO    WO 2008/088551 A1    7/2008
(Continued)

OTHER PUBLICATIONS

Gassert et al., "Advantages of transparent conducting oxide thin films with controlled permittivity for thin film photovoltaic solar cells," Jan. 20, 2011, Thin Solid Films 519, pp. 7146-7148.*
(Continued)

*Primary Examiner* — Robert Vetere
(74) *Attorney, Agent, or Firm* — Robert G. Pittelkow (57) ABSTRACT A thin film photovoltaic device (100) with a tunable, minimally conductive buffer (128) layer is provided. The photovoltaic device (100) may include a back contact (150), a transparent front contact stack (120), and an absorber (140) positioned between the front contact stack (120) and the back contact (150). The front contact stack (120) may include a low resistivity transparent conductive oxide (TCO) layer (124) and a buffer layer (128) that is proximate to the absorber layer (140). The photovoltaic device (100) may also include a window layer (130) between the buffer layer (128) and the absorber (140). In some cases, the buffer layer (128) is minimally conductive, with its resistivity being tunable, and the buffer layer (128) may be formed as an alloy from a host oxide and a high-permittivity oxide. The high-permittivity oxide may further be chosen to have a bandgap greater than the host oxide.

22 Claims, 7 Drawing Sheets (51) Int. Cl.
  *H01L 31/0224* (2006.01)
  *H01L 31/073* (2012.01)
  *H01L 31/0749* (2012.01)
  *H01L 31/18* (2006.01)

(52) U.S. Cl.
  CPC ....... *H01L31/0749* (2013.01); *H01L 31/1828* (2013.01); *H01L 31/1836* (2013.01); *H01L 31/1884* (2013.01); *Y02E 10/541* (2013.01); *Y02E 10/543* (2013.01); *Y02P 70/521* (2015.11)

(56) References Cited

U.S. PATENT DOCUMENTS

| | | | |
|---|---|---|---|
| 5,248,884 A | 9/1993 | Brewitt-Taylor et al. | |
| 5,348,594 A | 9/1994 | Hanamura et al. | |
| 5,909,623 A | 6/1999 | Saihara | |
| 5,909,632 A | 6/1999 | Gessert | |
| 5,922,142 A | 7/1999 | Wu | |
| 6,042,752 A | 3/2000 | Mutsui | |
| 6,137,048 A | 10/2000 | Wu | |
| 6,169,246 B1* | 1/2001 | Wu | H01L 31/022466 136/265 |
| 6,180,870 B1 | 1/2001 | Sano et al. | |
| 6,221,495 B1 | 4/2001 | Wu | |
| 6,246,071 B1 | 6/2001 | Qadri et al. | |
| 6,281,035 B1 | 8/2001 | Gessert | |
| 6,569,548 B2 | 5/2003 | Yamamoto et al. | |
| 6,606,333 B2 | 8/2003 | Kadota | |
| 6,677,063 B2 | 1/2004 | Finley | |
| 6,685,623 B2 | 2/2004 | Presthus et al. | |
| 6,733,895 B2 | 5/2004 | Kadota et al. | |
| 6,787,253 B2 | 9/2004 | Iwabuchi et al. | |
| 6,852,623 B2 | 2/2005 | Park et al. | |
| 6,908,782 B2 | 6/2005 | Yan | |
| 6,936,761 B2 | 8/2005 | Pichler | |
| 7,071,121 B2 | 7/2006 | Punsalan et al. | |
| 7,186,465 B2 | 3/2007 | Bright | |
| 7,699,965 B2 | 4/2010 | Ikisawa et al. | |
| 7,727,910 B2 | 6/2010 | Ahn et al. | |
| 8,084,682 B2 | 12/2011 | Chen | |
| 8,253,012 B2 | 8/2012 | Gessert et al. | |
| 8,734,621 B2 | 5/2014 | Gessert et al. | |
| 8,747,630 B2 | 6/2014 | Gessert et al. | |
| 2001/0013361 A1* | 8/2001 | Fujisawa | H01L 31/02246 136/256 |
| 2002/0036286 A1 | 3/2002 | Ho et al. | |
| 2003/0121468 A1 | 7/2003 | Boone et al. | |
| 2003/0207093 A1* | 11/2003 | Tsuji | C23C 16/407 428/209 |
| 2003/0218153 A1 | 11/2003 | Abe | |
| 2004/0081836 A1 | 4/2004 | Inoue et al. | |
| 2005/0062134 A1 | 3/2005 | Ho et al. | |
| 2005/0276987 A1 | 12/2005 | Fujisawa et al. | |
| 2006/0118406 A1 | 6/2006 | Delahoy | |
| 2006/0289091 A1 | 12/2006 | Buonassisi et al. | |
| 2007/0000537 A1 | 1/2007 | Leidholm | |
| 2007/0007125 A1 | 1/2007 | Krasnov | |
| 2007/0116986 A1 | 5/2007 | Garg et al. | |
| 2008/0118777 A1 | 5/2008 | Li et al. | |
| 2008/0296569 A1 | 12/2008 | Ho et al. | |
| 2009/0053511 A1* | 2/2009 | Kim | B32B 17/10036 428/332 |
| 2009/0162560 A1 | 6/2009 | Deluca et al. | |
| 2009/0194165 A1 | 8/2009 | Murphy et al. | |
| 2009/0197757 A1 | 8/2009 | Fukushima | |
| 2009/0242029 A1 | 10/2009 | Paulson et al. | |
| 2009/0297886 A1 | 12/2009 | Gessert et al. | |
| 2010/0024876 A1 | 2/2010 | McClary et al. | |
| 2010/0059112 A1 | 3/2010 | Gupta et al. | |
| 2010/0108503 A1 | 5/2010 | Bartholomeusz et al. | |
| 2010/0171082 A1 | 7/2010 | Gessert et al. | |
| 2010/0203364 A1 | 8/2010 | Fortmann | |
| 2010/0206372 A1 | 8/2010 | Buller et al. | |
| 2010/0233836 A1 | 9/2010 | Kyotani et al. | |
| 2010/0243039 A1 | 9/2010 | Korevaar | |
| 2011/0005591 A1 | 1/2011 | Buller et al. | |
| 2011/0011460 A1 | 1/2011 | Munteanu et al. | |
| 2011/0041917 A1 | 2/2011 | Dauson et al. | |
| 2011/0061737 A1 | 3/2011 | Hotz et al. | |
| 2011/0084239 A1 | 4/2011 | Gessert et al. | |
| 2011/0094416 A1 | 4/2011 | Kawai et al. | |
| 2011/0108099 A1 | 5/2011 | Pinarbasi et al. | |
| 2011/0121378 A1 | 5/2011 | Ahn et al. | |
| 2011/0197958 A1 | 8/2011 | Li et al. | |
| 2011/0240123 A1 | 10/2011 | Lin et al. | |
| 2011/0259418 A1 | 10/2011 | Hollars | |
| 2011/0312120 A1 | 12/2011 | Weiner et al. | |
| 2011/0315220 A1 | 12/2011 | Korevaar | |
| 2012/0031492 A1 | 2/2012 | Sevvana et al. | |
| 2012/0043215 A1 | 2/2012 | Basol | |
| 2012/0097222 A1 | 4/2012 | Gessert et al. | |
| 2012/0107491 A1 | 5/2012 | Li et al. | |
| 2012/0192948 A1 | 8/2012 | Basol | |
| 2012/0305064 A1* | 12/2012 | Johnson | H01L 31/0352 136/256 |
| 2013/0213478 A1 | 8/2013 | Munteanu et al. | |

FOREIGN PATENT DOCUMENTS

| | | |
|---|---|---|
| WO | 2009116990 | 9/2009 |
| WO | WO 2009/117072 A1 | 9/2009 |
| WO | WO 2011/049933 A1 | 4/2011 |
| WO | 2011075579 | 6/2011 |
| WO | 2011126709 | 10/2011 |
| WO | WO 2011/149982 A2 | 12/2011 |
| WO | WO 2013/119550 A1 | 8/2013 |
| WO | WO 2014/077895 A1 | 5/2014 |

OTHER PUBLICATIONS

Gessert, et al., "Evolution of DcS/CdTe Device Performance During Cu Diffusion", Proc. 31th IEEE PV Specialists Conference, IEEE, Piscataway, New Jersey, 2005, pp. 291-294.

Gessert, et al., "Formation of AnTe:Cu/Ti Contacts at High Temperature for CdS/CdTe Devices", Proc. 4th WCPVEC, IEEE, Piscataway, New Jersey, 2006, pp. 432-435.

Gessert, et al., "Dependence of Carrier Lifetime on Cu-Contacting Temperature and ZnTe:Cu Thickness in CdS/CdTe Thin Film Solar Cells", Thin Solid Fims vol. 517, Issue 7, Feb. 2, 2009, pp. 2370-2373.

Streetman, "Solid State Electronic Devices", Second Edition, Prentice-Hall, Inc. Englewood Cliffs, New Jersey, 1980, pp. 136-140.

SZE, "Physics of Semiconduct Devices", John Wiley & Sons, New York, New York, 1918, pp. 74-77.

International Search Report and Written Opinion for PCT Patent Application No. PCT/13/41431 mailed Oct. 11, 2013 (PCT/12-42).

Coutts, et al., "Characterization of Transparent Conducting Oxides", MSR Bulletin, vol. 25, Aug. 2000, pp. 58-65.

Gessert, "Progress and Roadmap Alignment Company or Organization: National Center for Photovltaics [sic.] Funding Opportunity: EE&RE", presented a the Solar Energy Technologies Program (SETP) Annual Program Review Meeting held Aug. 22-24, 2008 in Austin Texas.

Gessert, et al., "Advantages of transparent conducting oxide thin films with controlled permitivity for thin film photovoltaic solar cells", Thin Solid Films, vol. 519, Issue 21, Aug. 31, 2011, pp. 7146-7148.

Gessert, et al., "High Transparency Supttered In2O3 and ITO Films Containing Zirconium", presented at the AVS 54th International Symposium & Exhibition held Oct. 14-17, 2007 in Seattle, Washington.

Burst, et al., "RF-Sputtered ITO and ITO:Zr Studied by in SITU Spectroscopic Ellipsometry", presented at 2010 35th IEEE Photovoltaic Specialists Conference (PVSC) held Jun. 20-25, 2010 in Honolulu, Hawaii, pp. 2408-2412.

Calnan, et al., "High mobility transparent conducting oxides for thin film solar cells", Thin Solid Films, vol. 518, Issue 7, Jan. 31, 2010, pp. 1839-1849.

(56) References Cited

OTHER PUBLICATIONS

Burst, et al., "Recent Developments in Transparent Conducting Oxides for Thin-Film Solar Cells", (Abstract), AVS 57th International Symposium & Exhibition held Oct. 17-22, 2010 in Albuquerque, New Mexico.
Miyata, et al., "New transparent conducting thin films using multicomponet oxides of ZnO and V2O5 prepared by magnetron sputtering", Thin Solid Films, vol. 411, Issue 1, May 22, 2002, pp. 76-81.
Tamura, et al., "Donor-acceptor pair luminescence in nitrogen-doped ZnO films grown on lattice-matched ScAlMgO4 (0001) substrates", Solid State Communications, vol. 127, Issue 4, Jul. 2003, pp. 265-269.
Kaminska, et al., "Properties of p-Type ZnO Grown by Oxidation of Zn-Group-V Compounds", Material Research Society Symposium Proceedings, vol. 957, Fall 2006, pp. 121-126.
Wang, et al., "Growth of p-type ZnO thin films by (N, Ga) co-doping using DMHy dopant", Journal of Physics D: Applied Physics, vol. 40, No. 15, Aug. 7, 2007, pp. 4682-4685.
Tompa, et al., "A comparative study of MOCVD produced ZnO films doped with N, As, P and Sb", Material Research Society Symposium Proceedings, vol. 957, Fall 2007, pp. 283-287.
Exharhos, et al., "Discovery-based design of transparent conducting oxide films", Thin Solid Films, vol. 515, Issue 18, Jun. 25, 2007, p. 7025-7052.
Haacke, "Transparent Conduction Coatings", Annual Review of Materials Science, vol. 7, Aug. 1997, pp. 73-93.
Chopra et al., "Transparent Conductor—A Status Review", Thin Solid Films, vol. 102, Issue 1, Apr. 1983, pp. 1-46.
Kanai, "Electrical Properties of In2O3 Singe Crystals Doped with Metallic Donor Impurity", Japan Journal of Applied Physics, vol. 23, No. 1, Jan. 1984, p. 127.
Yoshida, et al., "Thin-Film Indium Oxide Doped with Refractory Metals", MSR Symposium Proceedings., vol. 747, 2003, pp. V1.4.1-V1.4.6.
Gessert, et al., "Summary Abstract: The dependence of the electrical properties of ion-beam sputtered indium tin oxide on its composition and structure", Journal of Vacuum Science &Technology A, vol. 5, No. 4, Jul./Aug. 1987, pp. 1314-1315.
Kostlin, "Electrical Properties and Defect Model of Tin-Doped Indium Oxide Layers", Applied Physics A, vol. 27, Issue 4, Apr. 1982, pp. 197-206.
Ohta, et al., "Highly electrically conductive indium-tin-oxide thin films epitaxially grown on yttria-stabilized zirconia (100) by pulsed-laser deposition", Applied Physics Letters, vol. 76, No. 19, May 8, 2000, pp. 2740-2742.
Ohta, et al., "Surface morphology and crystal quality of low resistive indium tin oxide grown on yttria-stabilized zirconia", Journal of Applied Physics, vol. 91, No. 6, Mar. 15, 2002, pp. 3547-3550.
International Search Report for PCT Patent Application No. PCT/US2013/024743 mailed Apr. 4, 2013 (NREL PCT/11-75).
Meng, et al., "Molybdenum-doped indium oxide transparent conductive thin films", Journal of Vacuum Science & Technology A, vol. 20, No. 1, Jan./Feb. 2002, pp. 288-290.
Chen, et al., "Effects of metal-doped indium-tin-oxide buffer layers in organic light-emitting devices", Journal of Applied Physics, vol. 99, Issue 11, Jun. 1, 2006, pp. 114515-1-114516-6.
Li, et al., "Organic light-emitting device with surface-modified tungsten-doped indium oxide anode", Electronics Letters, vol. 44, No. 13, Jun. 19, 2008, 2 pages.

Bradley, D., "Metal Alkoxides as Precursors for Electronc and Ceramic Materials", Chemical Review, vol. 89, Issue 6, Sep. 1, 1989, pp. 1317-1322.
Coburn, J., et al., "A Study of the Neutral Species rf Sputtered form Oxide Targets", Japan Journal of Applied Physics, Suppl. 2, Pt. 1, 1974, pp. 501-504.
Gessert, T., et al., "Studies of ZnTe Back Contacts to CdS/CdTe Solar Cells", presented at the Proceedings of 26th IEEE Photovoltaic Specialists Conference, Sep. 30-Oct. 3, 1997,pp. 419-422, Anaheim, California.
Gessert, T., et al., "Study of ZnTe:Cu/Metal Interfaces in CdS/CdTe Photovoltaic Solar Cells", presented at the Fall MRS Meeting, Dec. 1-5, 2003, Boston Massachusetts, Material Research Society Proceedings vol. 796, 2004, pp. 79-84.
Gessert, T., et al., "Analysis of CdS/CdTe Devices Incorporating a ZnTe:Cu Contact", Thin Film Solid Films, vol. 515, Issue 15, May 31, 2007, pp. 6103-6106.
Groth, R., "A study of semiconducting indium oxide films", Phys. Stat. Sol. 14, 69 (1966), pp. 69-75 (with full English translation).
Mills, K.C., Thermodynamic Data for Inorganic Sulphides, Selenides and Tellurides (Butterworths, London, 1974), p. 56.
Transene Company, Inc.—"Palladium Etchant—Type TFP Titanium Etchant—Type TFT" Bulletin #223-224.
Wan, C., et al., "LPCVD of Tin Oxide From Tetramethyltin and Oxygen", Journal of Electrochemical Society, vol. 136, No. 5, May 1989, pp. 1459-1463.
Wei, S. et al., "Chemical trends of defect formation and doping limit in II-VI semiconductors: The case of CdTe", Physical Review B, vol. 66, Issue 15, Oct. 15, 2002, pp. 155211-1-155211-10.
International Preliminary Report on Patentability for PCT Patent Application No. PCT/US2013/024743 mailed Aug. 12, 2014.
International Search Report for PCT Patent Application No. PCT/US2013/043250 mailed Nov. 1, 2013.
International Preliminary Report on Patentability for PCT Patent Application No. PCT/US2013/043250 mailed May 19, 2015.
International Search Report for PCT Patent Application No. PCT/US2007/060553 mailed Oct. 10, 2007.
International Preliminary Report on Patentability for PCT Patent Application No. PCT/US2007/060553 mailed Jul. 30, 2009.
International Search Report for PCT Patent Application No. PCT/US2008/057244 mailed Nov. 26, 2008.
International Preliminary Report on Patentability for PCT Patent Application No. PCT/US2008/057244 mailed Sep. 21, 2010.
Written Opinion for PCT Patent Application No. PCT/US2013/024743 mailed Apr. 4, 2013.
Written Opinion for PCT Patent Application No. PCT/US2013/043250 mailed Nov. 1, 2013.
Written Opinion for PCT Patent Application No. PCT No. PCT/US2007/060553 mailed Oct. 10, 2007.
Written Opinion for PCT Patent Application No. PCT/US2008/057244 mailed Nov. 26, 2008.
Haacke, "New Figure of Merit for Transparent Conductors", Journal of Applied Physics, Sep. 1976, vol. 47, No. 9, pp. 4086-4089.
Li et al., "The Properties of Cadmium Tin Oxide Thin-Film Compounds Prepared by Linear Combinatorial Synthesis", Applied Surface Science, 2004, vol. 223, pp. 138-143.
Song et al., "Spectroscopic Ellipsometry Characterization of $ZrO_2$ Films on Si(100) Deposited by High-Vacuum-Metalorganic Chemical Vapor Deposition", Journal of Vacuum Science & Technology A, 2004, vol. 22, pp. 711-718.

* cited by examiner

THIN FILM PHOTOVOLTAIC DEVICES WITH A MINIMALLY CONDUCTIVE BUFFER LAYER

CROSS-REFERENCE TO RELATED APPLICATIONS

The present application is a national stage entry of International Application No. PCT/US13/24743, filed Feb. 5, 2013, which claims priority from U.S. Provisional Application No. 61/597,424, filed Feb. 10, 2012, the entire disclosures of which are incorporated herein by reference.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

With regard to renewable energy, solar cells are devices that have characteristics that enable them to convert the energy of sunlight into electric energy. The aim of research often is to achieve solar cell designs with the lowest cost per watt generated by the solar cell, and, concurrently, the designs should provide solar cells that are suitable for inexpensive commercial production.

A conventional thin film solar cell is composed of a stacking of thin layers on a rigid or flexible substrate. The thin layers form one or more junctions that absorb light and convert it into electricity. Briefly, a typical thin film photovoltaic (PV) device, such as a thin film solar cell, may include a glass, metal, or polymer substrate, a back contact, an absorber, a window layer, a front contact or low resistivity layer, and a top protective layer (e.g., a glass substrate) or a similar arrangement of thin film layers. An alternative arrangement would be a transparent superstate (e.g., glass or polymer), a front contact layer, a buffer layer, a window layer, an absorber, a back contact, and a protective backsheet.

Presently, most thin film solar cells are fabricated with an absorber or absorber layer formed of cadmium telluride (CdTe) or copper indium gallium selenide (CIGS). An absorber formed of either material has a high optical absorption coefficient and suitable optical and electrical characteristics. With regard to CdTe solar cells, much of the recent research efforts has been directed at producing CdTe structures that allow more light to penetrate the top layers of the device (e.g., the transparent conducting contacts, the buffer layer, and the window layer, which is often formed of cadmium sulfide (CdS)) to achieve high efficiency. While with CIGS solar cells, work continues to provide better methods of producing a CIGS thin film layer that is of proper composition and structure to allow charges generated by received sunlight (i.e., electrons and holes) to exist long enough in the CIGS layer of the device so that they can be separated and collected at the front and back contacts to provide higher conversion efficiency.

A modification to solar cells was made when the current, voltage, and fill factor of the cells were found to be limited by a number of factors including roughness of the superstate and front contact layer, pinholes in the window and absorber layer, space charge collapse, and other factors. These factors were all exacerbated when cells were scaled up in size to make larger area products called modules. Solar cell modules were found to be more sensitive to these effects than small solar cells, and it was found useful to provide an additional layer called a buffer layer (as well as an intrinsic layer or a high-resistive transparent (HRT) layer) between the front contact layer and the window layer. To allow light to pass to the absorber layer, the buffer layer typically is formed of a transparent, moderately conducting oxide such as tin oxide ($SnO_2$) and serves many functions in the cell or module while having a high enough resistivity to both match the window (e.g., CdS) layer and provide adequate protection against shunting from the transparent conductive oxide (TCO) to the absorber when the window layer is relatively thin and/or contains pinholes.

While sometimes labeled a "high resistivity" layer, it is more accurate to think of this layer as a minimally conductive layer because the cell's function is enhanced when the buffer layer has a more intermediate resistivity. However, the PV and glass industries have found it difficult to manufacture a buffer layer with intermediate resistivity especially when employing commercial deposition processes and industry standard precursors (e.g., chlorine (Cl)-containing organo-tin compounds). In contrast, it is often straightforward to produce a highly resistive buffer layer or a highly conductive buffer layer. There remains a need for a method of providing a buffer layer that is minimally conductive while still providing other desired properties for a thin film PV device including near zero optical absorption and low surface roughness. It is also desirable that the resistivity (and conductivity) of the buffer layer be readily tunable to suit the design of the absorber and other layers of the PV stack.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Many thin film photovoltaic (PV) devices rely on a transparent conductive oxide (TCO) layer and a buffer layer stack to form the front contact of the PV device. In prior devices, the buffer layer has usually been an undoped or unintentionally doped metal oxide, e.g., the TCO material used in the TCO layer, with a low carrier concentration and relatively high resistivity. Exemplary buffers layers were a buffer layer of tin oxide ($SnO_2$) used on an absorber formed of a layer of CdTe or a buffer layer of zinc oxide (ZnO) used on an absorber formed of CIGS. The $SnO_2$ buffer layer in a CdTe device ideally has a resistivity close to 1 ohm-cm, which matches the resistivity of the window layer (e.g., a thin film of CdS or the like). The ZnO buffer layer in a CIGS device usually has a sheet resistance close to $10^6$ ohm/sq. In forming a buffer layer, it is typically desirable that the buffer layer is thin, such as about 100 nm, and has particular properties that facilitate operation of the PV device, such as near zero optical absorption, low carrier concentration, and very low surface roughness.

Current commercial $SnO_2$ production or deposition processes that could be used to provide a buffer layer use chlorinated tin precursors. Chlorine is an n-type dopant in $SnO_2$, which is acceptable when making a front contact TCO layer, e.g., with a thin film of $SnO_2$:F for which doping is desirable. However, the manufacturers of CdTe devices would prefer to obtain glass (a glass substrate) that is coated with a $SnO_2$:F/$SnO_2$ bilayer stack (front contact TCO layer with a buffer). Typically, it may also be desirable for the resistance of the buffer layer or $SnO_2$ to be close to 1 ohm-cm and the carrier concentration to be below $10^{19}$ $cm^{-3}$.

Unfortunately, the residual chlorine from the tin precursor makes it difficult or even impossible to produce the desired buffer layer, e.g., a buffer with an intermediate amount of resistivity (enabled by a low carrier concentration) or, stated differently, a minimally conductive buffer. Further, existing commercial buffer layer technologies require excessive added heat to remove the chlorine or employment of a co-dopant to compensate for the excess carriers generated by chlorine, neither of which has been successfully implemented. In such commercial processes, the relatively "high" buffer layer resistivity that may be achieved is on the order of 0.2 to 0.5 ohm-cm, which is unacceptably low for most thin film PV applications.

With these issues in mind, a method for manufacturing or providing a minimally conductive buffer layer for thin film PV devices, such as for CdTe and CIGS solar cells, is described herein that can be readily implemented in on-line commercial processes. Briefly, in one particular embodiment, the buffer layer may be synthesized or generated by alloying a TCO material, such as $SnO_2$, with a wide bandgap, high permittivity oxide material, such as zirconium oxide, to block (or even prevent) effective doping of the TCO material. This process may be thought of as inoculating the buffer against doping.

The added alloy material or "additive" may generally be any material that has a higher bandgap relative to the host oxide, e.g., higher than the TCO material such $SnO_2$ in some examples. By providing such an additive in the buffer deposition step, the bandgap is increased, and, in many commercial processes, this pushes the chlorine (Cl) states deeper into the gap, thereby efficiently rendering the Cl ineffective as a dopant. Of interest to those using current commercial $SnO_2$ production or deposition processes, the described methods allow glass manufacturers to tune the resistivity to desired ranges. For example, the tuning can be used to provide a buffer resistivity in the range of 0.5 to 5 ohm-cm or higher (e.g., to meet the often stated standard or specification of 1 ohm-cm in the buffer layer, which had previously only been achieved in non-commercial fabrication processes using research-grade precursors). As will be clear to those in the PV and glass industries, the fabrication methods taught herein provide a simple and commercially viable way to produce a tunable, high-resistance transparent oxide.

More particularly, a thin film photovoltaic (PV) device is provided with a tunable minimally conductive buffer layer. The PV device includes a back contact, a transparent front contact stack, and an absorber positioned between the front contact and the back contact. In the PV device, the front contact stack includes a low resistivity TCO layer and a buffer layer that is proximate to the absorber layer. The PV device may also include a window layer between the buffer and absorber. In some embodiments, the buffer layer is formed as an alloy from a host oxide and a high-permittivity oxide, with the high-permittivity oxide having a dielectric constant greater than 8 or a bandgap greater than the host oxide.

In some embodiments of the PV device, the host oxide is $SnO_2$, and, in such embodiments, the high-permittivity oxide may be an oxide of Zr, Ta, Ti, Mo, or Hf. In other embodiments of the PV device, the host oxide is $In_2O_3$, and the high-permittivity oxide is an oxide of Zr, Ta, Hf, or Mo. In still other embodiments, the host oxide is ZnO, and the high-permittivity oxide is an oxide of Zr, Ta, Hf, V, Y, or Sc. To fabricate the PV device, the absorber layer may be a thin film or layer of CdTe, CIGS, copper-zinc-tin-sulfide (CZTS), or the like. More generally, the host oxides may be $SnO_2$, $In_2O_3$, ZnO, or other TCO material, and the high permittivity oxide may include an oxide of Zr, Ta, Hf, Ti, Mo, V, Y, or Sc.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

The following description is directed generally to a method of fabricating thin film photovoltaic (PV) devices that include a tunable and minimally conductive buffer layer. The thin film PV devices described herein are formed by providing an additive as part of the deposition process or step for forming a buffer layer, and this results in alloying the additive with the host oxide (such as $SnO_2$). The additive may be nearly any material that has a higher bandgap than the host oxide (such as zirconium oxide, in the above example, to form the alloy Sn—Zr—O).

It was recognized that high permittivity oxide materials may be used as dopants and, likewise, as alloys in TCO thin films or layers to improve their optical properties, process robustness, and chemical resistance. High permittivity oxides may have extremely high bandgaps and poor electrical conductivity (high resistivity). With these concepts in mind, one method for fabricating buffers for thin film PV devices includes adding a high permittivity oxide as an additive during deposition/formation of the buffer layer. The high permittivity oxide may be provided in relatively large quantities (as compared with dopants in TCOs), and the result is a higher resistivity film (i.e., a minimally conductive buffer) with an acceptably low (or at least reduced) optical absorption in the visible range of light. Further, alloying with a high permittivity oxide may allow the buffer layer thickness to vary depending on the physics of a particular thin film PV device utilizing the new buffer layer. Varying the thickness allows a device designer to tune the optical stack properties to maximize transmission.

The use of high permittivity and/or high bandgap oxides as alloying additives as described herein provides a pathway for commercial production of insulating buffer layers in on-line and off-line coating methods. The tin precursors (e.g., dimethyltin chloride (DMTC), monobutyltin trichloride (MBTC), and the like) used in $SnO_2$:F/$SnO_2$ (or the front contact stack) production contain relatively large amounts of chlorine (Cl), which is a donor in $SnO_2$ similar to fluoride (F) except slightly less active. Chlorine is generally not considered to be overly detrimental to commercial $SnO_2$:F, but chlorine can make producing insulating $SnO_2$ (a desirable buffer layer) with a truly low carrier concentration ($<10^{19}$ cm$^{-3}$) very difficult. Particularly, the residual chlorine and cross contamination with upstream fluorine in on-line processes make it problematic to produce high quality bilayers demanded by the CdTe PV device industry.

It was recognized by the inventors that the commercial coaters' processes may be enhanced by adding high permittivity and/or high bandgap alloys to the i-$SnO_2$ buffer layer because the carrier concentration can be adequately reduced to produce a desirable buffer layer. The minimally conductive buffer layer can be achieved despite the residual chlorine and cross contamination because the alloy bandgap is increased a sufficient amount. As a result, it is likely that the use of an additive in the buffer deposition step may be beneficial for on-line deposition processes, such as in a chemical vapor deposition (CVD) as well as in on-line or off-line processes such as atmospheric pressure CVD (AP-CVD), spray pyrolysis, sputtering, and liquid processing steps. Advantages are provided because injecting or providing an additive during buffer formation leads to improvements in tunability of resistivity, transmission, chemical resistance, and process robustness. Further, the use of such an additive provides another "knob" for tuning or adjusting the optical and other properties, such as resistivity of the buffer layer and/or the transparent contact stack.

Figure 1:
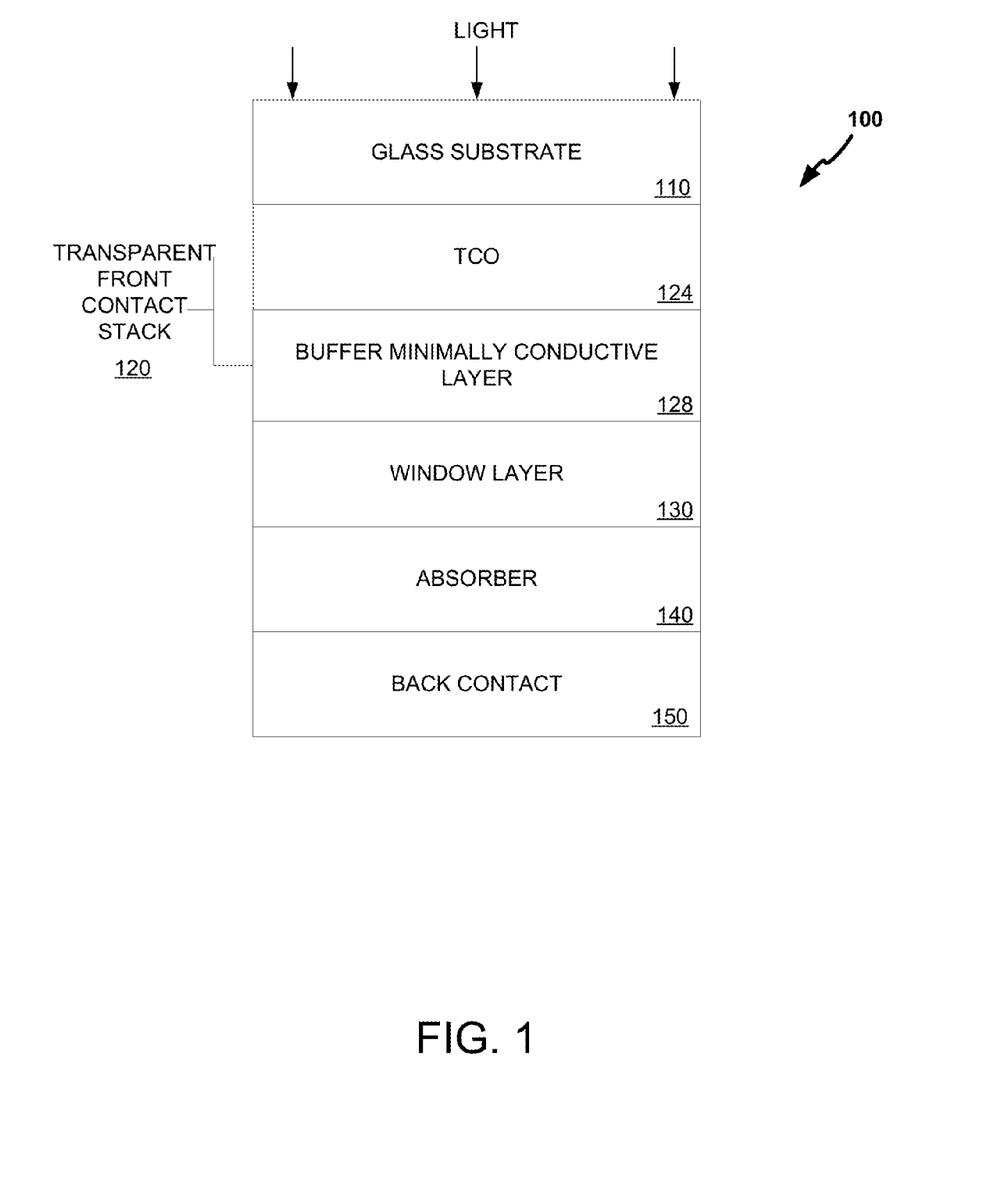
FIG. 1 is a schematic of a thin film PV device having a minimally conductive buffer layer formed by embodiments of methods described herein.

FIG. 1 illustrates an example of a thin film photovoltaic (PV) device 100 that may be fabricated according to techniques for providing an improved buffer and one that may be fabricated using processes well suited both for off-line processes and for on-line commercial coating or deposition processes. The PV device 100 includes a glass substrate 110 providing an upper or top surface for receiving light. A transparent front contact stack 120 is formed, typically through deposition or the like, on the substrate 110, and the transparent front contact stack 120 includes a transparent conducting oxide (TCO) layer (low resistivity layer) 124 adjacent the substrate 110. The PV device further includes an absorber layer 140, and a window layer 130 sandwiched between the absorber 140 and a minimally conductive buffer layer 128. The PV device further includes a back contact 150 abutting the absorber 140.

Instead of a conventional buffer, the PV device 100 includes the minimally conductive buffer layer 128 that is formed in some cases by injecting or providing a quantity of an additive during the deposition or formation of the buffer layer 128 using a particular host oxide. The additive may take numerous forms to suit the host oxide, and, generally, the additive will be a material with a bandgap higher than the host oxide. The quantity of additive provided also is typically greater than a doping amount such that the buffer layer 128 is an alloy (or includes alloy) rather than merely a doped film, and the additive may be considered an alloying additive.

Further, the additive is chosen to control electrical properties of the buffer 128, and, in some embodiments of the PV device 100, the additive is a high permittivity material such as a material or oxide with a dielectric constant greater than about 8 (e.g., an oxide with a permittivity greater than that of $SiO_2$). The use of high permittivity oxides may provide a way to control the resistivity of the minimally conductive buffer layer 128, and this control enables a producer of devices 100 to optimize the thickness of layer 128 and resistivity of layer 128 independently, which was not generally possible with prior buffers. For example, the resistivity may be set in the range of 0.5 to 1.5 ohm-cm (or higher), with a resistivity of about 1.0 ohm-cm being desirable in many devices 100.

Figure 2:
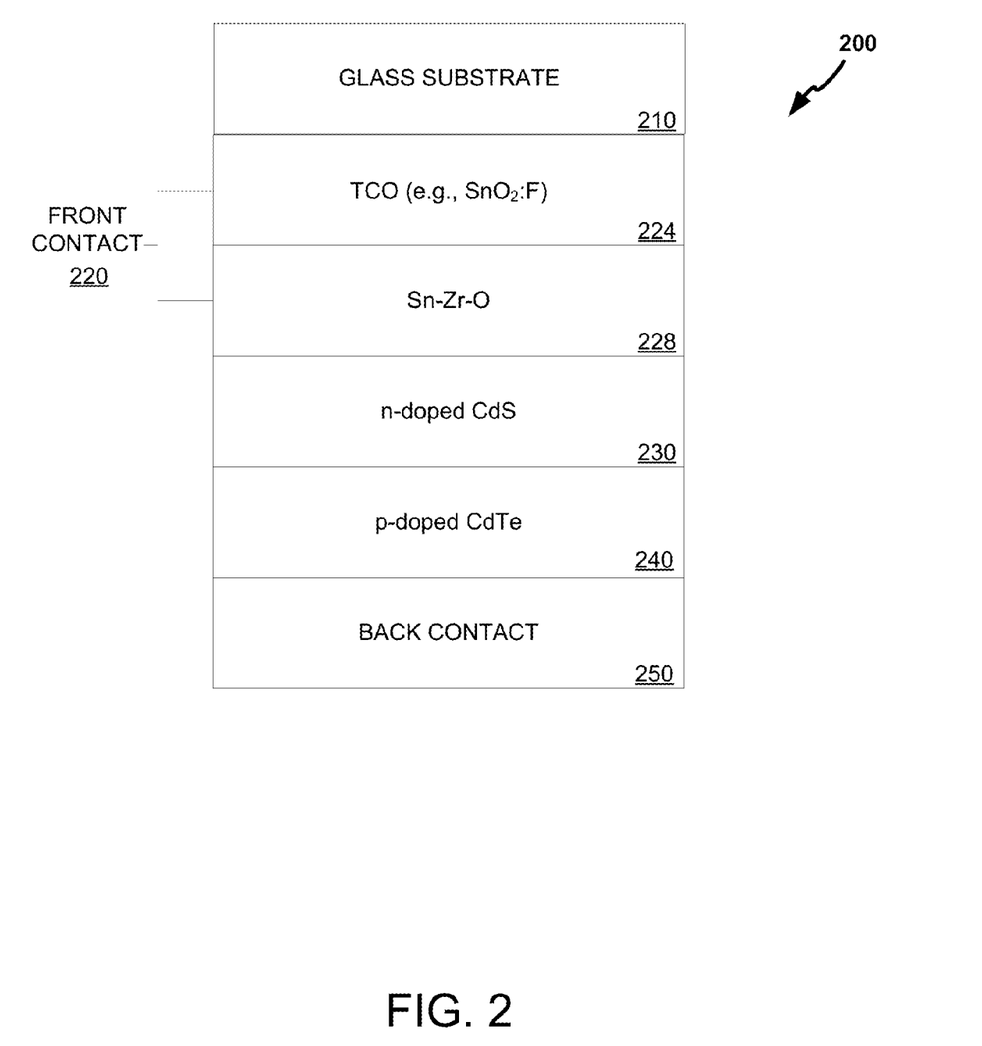
FIG. 2 illustrates a schematic of an exemplary CdTe solar cell including a minimally conductive buffer.

CdTe-based thin film solar cells are a staple of the PV industry, and it may be useful to illustrate a particular example of a CdTe solar cell 200 with reference to FIG. 2 that implements a minimally conductive buffer layer 228. As shown, the cell 200 is similar to PV device 100 in that it includes a glass substrate 210 upon which a front contact 220 is formed such as through coating or other deposition processes. The front contact 220 in this solar cell 200 includes a low resistivity layer 224 in the form of a thin film of TCO, and, in many solar cells 200, the TCO would be fluorine-doped tin oxide ($SnO_2$:F).

With a $SnO_2$:F layer 224 in contact 220, the solar cell 200 may include a minimally conductive buffer layer 228 in the form of an alloy such as Sn—Zr—O. In other words, the formation of buffer layer 228 may involve using an additive such as Zr or an oxide of Zr (as shown in FIG. 2) when the host oxide is $SnO_2$. Other additives may include tantalum (Ta), hafnium (Hf), molybdenum (Mo), their oxides, and the like in $SnO_2$.

The solar cell 200 further includes a window 230 that may be a thin film of n-doped CdS or the like. An absorber 240 is provided in the form of a thin film of p-doped CdTe, and a back contact 250 is provided adjacent to and contacting the absorber 240 such as a semiconducting interfacial layer or carbon layer and a film or foil of gold, Cu—Au, or Ni—Al.

In some CdTe-based thin film solar cells similar to cell 200, the TCO may take another form than $SnO_2$, and this may lead to use of a different alloy for the minimally conductive layer 228. For example, the TCO 224 may be a thin film of ITO (indium tin oxide). In this case, the host oxide for the buffer layer 228 may be $In_2O_3$ or $SnO_2$, and the additive used to form a useful alloy for buffer 228 may be an oxide zirconium (Zr), molybdenum (Mo), tantalum (Ta), hafnium (Hf), or the like and oxides of Zr, Mo, and the like.

Figure 3:
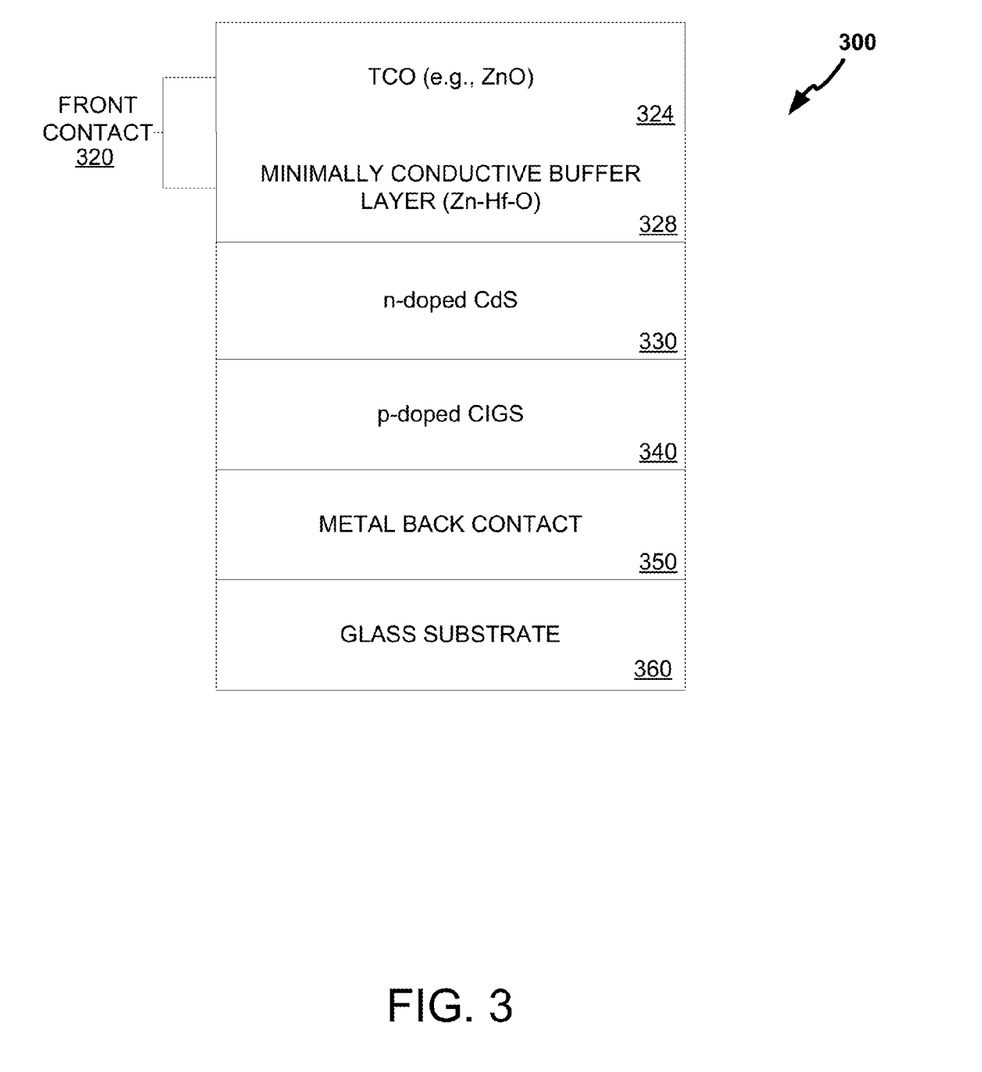
FIG. 3 illustrates a schematic of an exemplary CIGS solar cell including a minimally conductive buffer.

The alloying techniques for forming a tunable buffer in PV devices are also readily applicable to CIGS-based thin film solar cells such as cell 300 shown in FIG. 3. The CIGS solar cell 300 includes a front contact stack 320 that includes a low resistivity layer 324 and a minimally conductive buffer layer 328. The stack of device 300 further includes a window 330, such as a layer of n-type CdS or the like and then the absorber 340, which may be a thin film of p-type CIGS. The CIGS solar cell 300 further includes a metal back contact 350 (e.g., a layer of MO) and a glass substrate 360.

The low resistivity layer 324 may take the form of a thin film of ZnO or another TCO film. When the TCO film is ZnO, the additive used to form an alloy and provide buffer layer 328 may be selected from vanadium (V), yttrium (Y), scandium (Sc), zirconium (Zr), tantalum (Ta), hafnium (Hf), and the like and oxides thereof. In FIG. 3, the minimally conductive buffer layer 328 is shown to include the alloy Zn—Hf—O (e.g., Hf was the additive in the deposition or formation step for buffer 328 with the ZnO being the host oxide). Chemical stability may be one of the key design issues for cells 300 using a thin film of ZnO in the contact stack 320 such as if the glass industry wants to commercialize doped ZnO/i-ZnO for use in CdTe or other superstrate systems. The fabrication techniques described herein may be used to provide a chemically and thermally robust ZnO that can survive deposition.

As discussed above, the process that is used to form a minimally conductive buffer layer in a thin film PV device may vary widely while still obtaining the results described herein. Particularly, the buffer forming step may involve a thin film deposition such as a chemical deposition (such as chemical vapor deposition (e.g., CVD, APCVD, or the like), chemical solution deposition, spray pyrolysis, plating, or the like), a physical deposition (such as sputtering, evaporation, or the like), or other deposition processes (such as reactive sputtering, epitaxy, or the like). The buffer layer is particularly useful in providing a buffer layer with tunable/adjustable properties including resistivity in on-line processes such as CVD.

Figure 4:
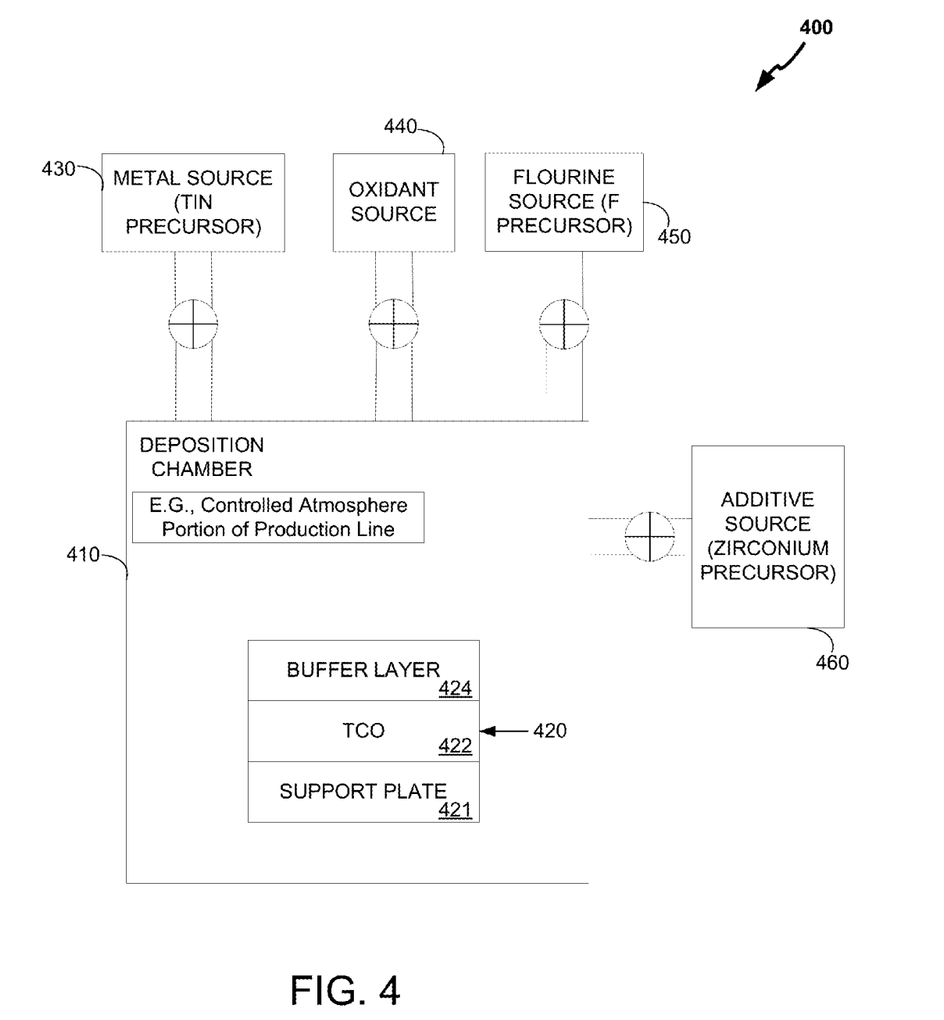
FIG. 4 is a functional block drawing or schematic of a deposition or processing chamber operable to fabricate a minimally conductive buffer layer in a PV device such as those shown in FIGS. 1-3.

With this wide range of processes useful in forming a buffer layer in mind, it may be useful to consider one exemplary, but non-limiting, deposition process. FIG. 4 illustrates a fabrication assembly or system 400 for use in fabricating thin film PV devices. The assembly 400 includes a deposition chamber 410 (e.g., a vacuum or a controlled ambient chamber or, more generally, any portion of a production line (e.g., a float line) with a controlled atmosphere) in which a thin film stack (e.g., a thin film workpiece) 420 is positioned. The stack or workpiece 420 includes a support plate (or glass or polymer substrate) 421 (which may be heated in many applications). As shown, the glass or polymer substrate 421 is in the process of coating or deposition to form the transparent front contact stack with a low resistivity or TCO layer 422 and a minimally conductive buffer layer 424. In some embodiments, an optional barrier or optical matching layer may be provided between the TCO 422 and glass support 421.

To form layers 422, 424, the fabrication assembly 400 is shown to include a number of material/precursor sources 430-460 that can be selectively operated (e.g., via valves) to provide a quantity of a precursor into the chamber 410. As shown, the sources or supplies for chamber 410 include a metal source 430 such as a tin precursor, an oxygen or oxidant source 440, a fluorine source 450 such as an F precursor, and, to form the buffer layer 424, an additive source 460 such as a zirconium precursor.

In one embodiment, for example, the assembly 400 is used to form a buffer layer of Sn—Zr—O alloy on a TCO of $SnO_2$:F. Tin oxide deposition uses one precursor for each element wanted in the final product on PV device 420. For a conducting $SnO_2$:F or thin film 422, a tin precursor 430, a fluorine precursor 450, and an oxidant(s) 440 are provided and injected or fed into the chamber 410. The source 430 may provide a tin precursor such as, but not limited to: DMTC $((CH_3)_2SnCl_2)$; TMTC $((CH_3)_3SnCl)$; MBTC $(C_{12}H_{27}ClSn)$; DBTC $(C_8H_{18}Cl_2Sn)$; TBTC $([CH_3(CH_2)_3]_3SnCl)$; Tetramethyltin; N,N'-Di-t-butyl-2,3-diamidobutane-tin(II); Tetrakis(dimethylamino)tin(IV); Tin(IV) t-butoxide; Tin(II) acetylacetonate; and Tin(II) hexafluoroacetylacetonate. The source 440 may provide an oxidizer such as $O_2$ and/or $H_2O$. The source 450 may provide an F precursor such as: HF; Trifluoroacetic acid $(CF_3COOH)$; $F_2$; $SF_6$; $C_2F_6$; and $CF_4$.

For an insulating $SnO_2$, the operator would turn off the F at source 450. In contrast, to form the buffer 424 that is minimally conductive, the assembly 400 is operated so as to add a Zr precursor to the Sn precursor and oxidizer molecules by activating or operating source 460 to provide a relatively large quantity (more than used for mere doping) of a zirconium precursor in the chamber 410 to provide or cause alloying (e.g., form Sn—Zr—O in or as layer 424). The zirconium precursor provided by source 460 may take a variety of forms such as one or more of: Tetrakis(diethylamino)zirconium; Zirconium(IV) t-butoxide; Zirconium(IV) ethoxide; Tetrakis(2,2,6,6-tetramethyl-3,5-heptanedionato)zirconium; Zirconium(IV) hexafluoroacetylacetonate; Zirconium(IV) trifluoroacetylacetonate; Bis(cyclopentadienyl)dimethylzirconium; and Dimethylbis(t-butylcyclopentadienyl)zirconium.

As will be understood for on-line coating/processing embodiments or operations of assembly 400, separate deposition zones (not shown) may be provided for depositing the layers 422 and then 424 on the PV device 420. In such embodiments, the source 450 providing the F precursor is left on during deposition of the layer 424, which would not generally be done intentionally on conventional processing lines. Even if the deposition zones are narrow and not well separated, this would maintain the insulating quality of the undoped layer if some of the F precursor was oversprayed into the adjacent deposition zone.

Figure 5:
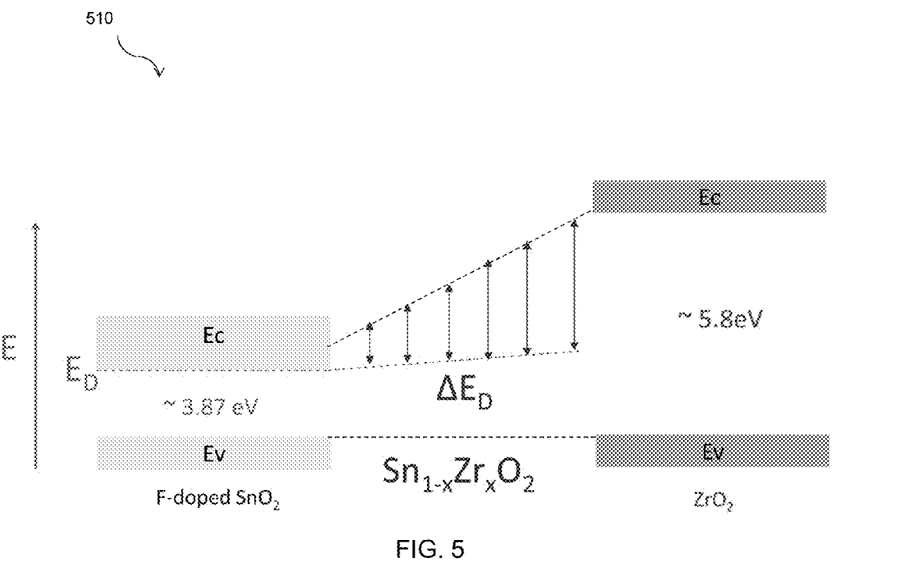
FIG. 5 is an energy band diagram illustrating increased bandgap in a minimally conductive buffer layer of the PV devices described herein.

FIG. 5 illustrates an energy band diagram 510 illustrating a bandgap engineering approach that can be used to provide or fabricate the minimally conductive buffer layers. Particularly, diagram 510 illustrates that for a thin film of $SnO_2$ that is doped with fluoride that the bandgap may be about 3.87 eV while $ZrO_2$ may have a bandgap of about 5.8 eV, as measured between the energy of the valence band maximum and the energy of the conduction band minimum. The inventors recognized that alloying the host oxide of $SnO_2$ with zirconium (or using a $ZrO_2$ additive) provides for a large increase or expansion in the bandgap relative to mere doping with F to a bandgap approaching that of the additive. It is also useful that the increase in bandgap is tunable by selecting the additive and the amount of additive added to create the alloy of the thin film providing the minimally conductive buffer layer. The amount of additive can be optimized to yield a film with ideal resistivity and match to the conduction band of the window layer.

Figure 6:
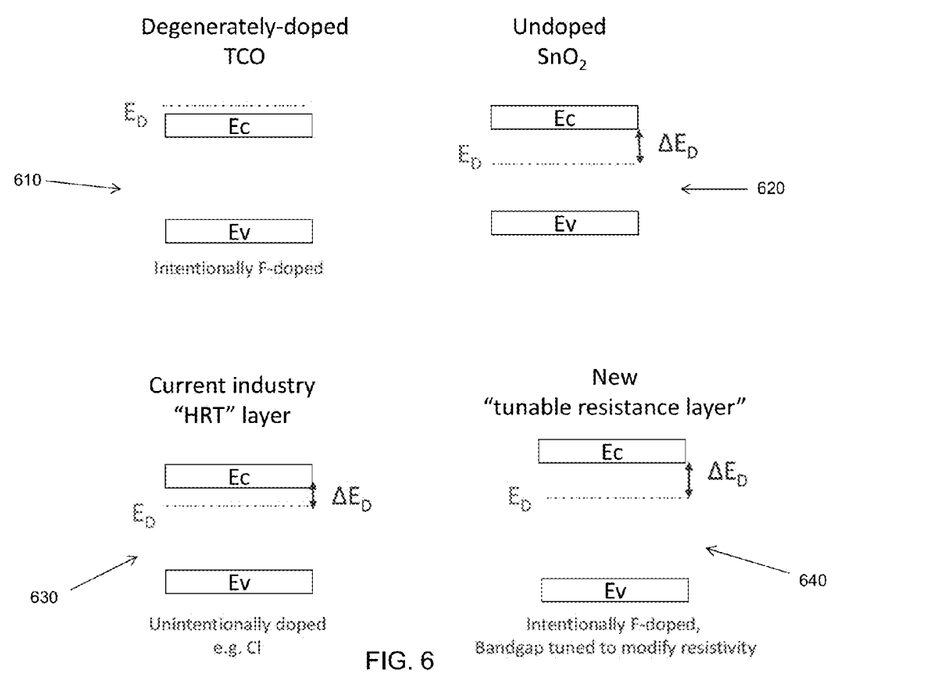
FIG. 6 illustrates with bandgap diagrams illustrating use of a bandgap engineering approach to provide with a tunable resistance layer or minimally conductive buffer layer.

FIG. 6 further illustrates, with diagrams 610, 620, 630, and 640, the bandgap engineering approach or changes in bandgap that may be provided with a tunable resistance layer or minimally conductive buffer layer. Bandgap diagram 610 shows a degenerately-doped case as is common for a standard TCO layer. As shown, the donor energy level ($E_D$) is in or above the conduction band ($E_C$). For an undoped thin film of $SnO_2$, made without Cl, as shown with bandgap diagram 620, the donor energy level or $E_D$ is below the conduction band with some energy difference ($\Delta E_D$). The donor energy level ($E_D$) is much closer to the conduction band ($\Delta E_D$ is much smaller) in typical industry "HRT" layers (which may be unintentionally doped with Cl or the like) as shown with bandgap diagram 630. This leads to excessive carriers and an undesirably low resistivity.

For the thin film shown in bandgap diagram 620, the energy difference may be high enough to provide a resistivity (such as about 1 ohm-cm) that works well for PV devices, e.g., for a CdTe superstrate device structure. However, the HRT layer shown in bandgap diagram 630, while having a somewhat increased resistivity, has a limited or much smaller energy difference ($\Delta E_D$) due to unintentional doping, and this detrimentally limits the performance of a PV device with such a buffer layer.

In contrast to either of the buffer layers shown in diagrams 620, 630, the minimally conductive buffer layer shown in bandgap diagram 640 may be intentionally or unintentionally doped and may include a tunable amount of a high-permittivity oxide to provide a larger energy difference ($\Delta E_D$). The new "tunable resistance layer" (or minimally conductive buffer layer) allows for the resistivity to be tuned to values even higher than the standard undoped layer (as shown in diagram 620). This can be achieved even with considerable doping (e.g., F or Cl-doping). These bandgap diagrams help explain the reasons for the effectiveness of the buffers taught herein and also confirm that the bandgap engineering approach should work well using industry standard materials and methods (e.g., with modification to inject an additive with a higher bandgap than the host oxide such as $ZrO_2$ when the host is $SnO_2$ as shown in FIG. 5).

Figure 7:
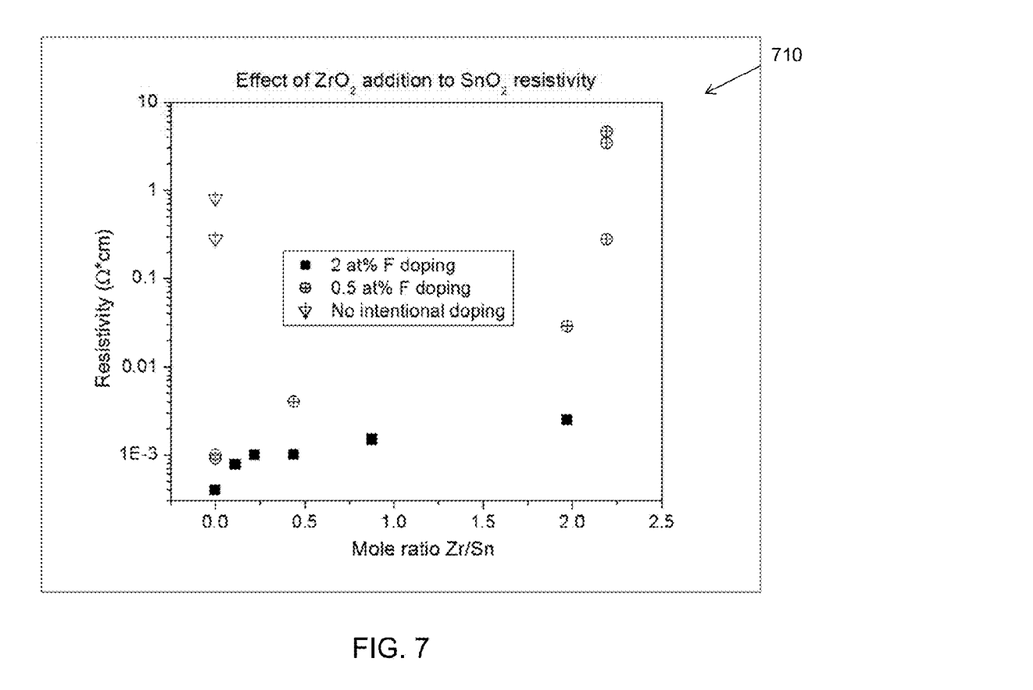
FIG. 7 illustrates a graph comparing resistivity (on vertical axis) with the mol ratio of a zirconium precursor (horizontal axis).

FIG. 7 illustrates a graph 710 comparing resistivity (on vertical axis) with the mole ratio of Zr to Sn (metals basis) on the horizontal axis. This ratio was calculated from the ratios of the zirconium precursor (e.g., ZTB) with respect to the host tin precursor (TMT). The graph shows the effect of the addition of $ZrO_2$ to the resistivity of $SnO_2$ (the host oxide) when creating a buffer layer. Three differing amounts of F-doping were used in this test run/implementation of the buffer manufacturing processes described herein. As shown, no intentional doping may provide useful levels of resistivity, but this may not be practical in many on-line coating processes.

In contrast, high resistance is maintained despite doping between about 0.5 and 2 at % F by adding increasing amounts of the high-permittivity additive. The resistivity becomes highly tunable by providing greater amounts of additive, as shown by increasing the molar ratio of Zr/Sn. In some cases, it may be useful to provide a molar ratio of about 2.0 or higher to achieve desired resistivity in the minimally conductive buffer layer (when the host oxide is $SnO_2$). The tunable resistivity is useful in controlling (or selecting) electrical properties of the buffer layer to provide a desirable contact for a thin film PV device, which may be important for matching a buffer to the absorber or other layers of the device stack (e.g., when the absorber is not CdTe).

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope. For example, the description stresses the use of the minimum resistivity buffer techniques with CIGS and CdTe cells and PV devices, but the described tunable resistivity may be useful with other PV material systems such as those including copper-zinc-tin-sulfide (CZTS). Hence, the description and following claims are intended to cover a variety of absorbers and/or PV material and not to be limited to only CIGS and CdTe-based devices.

In some ways, the process described above may be thought of as forming a buffer layer by mimicking the process of unintentional doping, and the inventors have proved its effectiveness in creating a buffer layer with tunable resistivity in a CVD process or other coating/deposition process. During deposition of a buffer layer, the process may include inputting or injecting zirconium or an organo-metallic compound/precursor. In the $SnO_2$ embodiment, the amount of zirconium or additive provided may be stated as a Zr/tin ratio of "X" (e.g., a ratio greater than a doping ratio), which can be predefined or be tuned to achieve a particular result.

The above described method may be described as alloying unintentionally doped TCO materials to render the film including the TCO materials more resistive despite the doping levels. The fabricated thin film is the layer in a PV device (such as a thin film solar cell) called the "intrinsic," "high-resistive transparent (HRT), or "buffer" layer, and this layer is sandwiched between the low resistivity TCO and the window or n-type layer in a thin film device with a p-type absorber. This buffer layer has an intermediate resistivity that is not too resistive, which would fail to make a good contact stack, and the manufacturing methods described herein make it possible to control resistivity, e.g., by controlling flow of the precursor for the additive or high-permittivity oxide.

The method may be used in CVD, spray, APCVD, sputtering, liquid processing, and other processing steps/techniques. The approach leads to a buffer layer that provides a hard, chemically resistive, thermally stable coating. The resistive film or buffer layer can be achieved even if large quantities of dopants are unintentionally or unavoidably included in film/deposition processes, and this is achieved using a wide bandgap oxide with a high dielectric constant (i.e., high permittivity) that is used to alter the conductivity of the buffer layer.

The invention claimed is:

1. A method comprising:
   determining, based on a desired electrical characteristic of an alloyed thin film buffer layer, an amount of an additive oxide precursor;
   injecting a host oxide precursor and the amount of the additive oxide precursor into a deposition chamber that contains a substrate coated with a transparent conductive oxide (TCO) layer; and
   forming the alloyed thin film buffer layer on the TCO layer by reacting the host oxide precursor to form a host oxide and reacting the additive oxide precursor to form an additive oxide,
   wherein the additive oxide has a bandgap higher than approximately 3.5 eV, and
   wherein a molar ratio of additive oxide to host oxide in the alloyed thin film buffer layer is between about 0.2 and about 0.7.

2. The method of claim 1, wherein the forming comprises performing at least one of chemical vapor deposition (CVD), atmospheric pressure CVD, high pressure CVD, spray pyrolysis, sputtering, reactive sputtering, epitaxy, chemical solution deposition, plating, spraying, liquid processing steps, evaporation, or operation of a thermal evaporator.

3. The method of claim 2, wherein the forming comprises performing atmospheric pressure CVD.

4. The method of claim 1, wherein the substrate comprises at least one of a glass or a polymer, and wherein the TCO comprises at least one of tin oxide, fluorine doped tin oxide, zinc oxide, or indium tin oxide.

5. The method of claim 1, wherein at least one of the host oxide precursor or the additive oxide precursor comprises at least one of a chlorinated species or a fluorinated species, and wherein the alloyed thin film buffer layer comprises at least one of chlorine or fluorine.

6. The method of claim 5, wherein the host oxide precursor comprises at least one of dimethyltin chloride (DMTC), monobutyltin trichloride (MBTC), $C_8H_{18}Cl_2Sn$ (DBTC), $[CH_3(CH_2)_3]_3$ SnCl (TBTC), tetramethyltin, N,N'-Di-t-butyl-2,3-diamidobutanetin(II), Tetrakis(diethylamino)tin(IV), Tin(IV) t-butoxide, Tin(II) acetylacetonate, or Tin(II) hexaflouroacetylacetonate.

7. The method of claim 5, wherein the additive oxide precursor comprises at least one of Tetrakis(diethylamino)zirconium, Zirconium(IV) t-butoxide, Zirconium(IV) ethoxide, Tetrakis(2,2,6,6-tetramethyl-3,5-heptanedionato)zirconium, Zirconium(IV) hexafluoroacetylacetonate, Zirconium(IV) trifluoroacetylacetonate, Bis(cyclopentadienyl)dimethylzirconium, or Dimethylbis(t-butylcyclopentadienyl)zirconium.

8. The method of claim 1, wherein the host oxide comprises at least one of $SnO_2$, ZnO, or $In_2O_3$.

9. The method of claim 1, wherein the additive oxide comprises at least one of an oxide of Zr, an oxide of Ta, an oxide of Ti, an oxide of Mo, an oxide of Hf, an oxide of V, an oxide of Y, or an oxide of Sc.

10. The method of claim 1, further comprising injecting an oxidizer into the deposition chamber, the oxidizer comprising at least one of oxygen or water.

11. The method of claim 1, further comprising injecting a fluorine precursor into the deposition chamber, the fluorine precursor comprising at least one of HF, trifluoroacetic acid, $F_2$, $SF_6$, $C_2F_6$, or $CF_4$.

12. The method of claim 1, wherein the alloyed thin film buffer layer comprises at least one of Sn—Zr—O, Zn—Hf—O, Zn—Zr—O, Zn—Ta—O, Zn—V—O, Zn—Y—O, Zn—Sc—O, Sn—Ta—O, Sn—Hf—O, In—Zr—O, In—Ta—O, In—Hf—O, or In—Mo—O.

13. The method of claim 12, wherein the alloyed thin film buffer layer comprises Sn—Zr—O having a molar ratio of Zr to Sn between 0.2 and 0.5.

14. The method of claim 1, wherein the alloyed thin film buffer layer comprises at least one of chlorine or fluorine at a concentration between about 0.5 mol % and about 2 mol %.

15. The method of claim 1, further comprising depositing a window layer on the alloyed thin film buffer layer.

16. The method of claim 15, wherein the window layer comprises n-doped cadmium sulfide.

17. The method of claim 15, further comprising depositing an absorber layer on the window layer.

18. The method of claim 17, wherein the absorber layer comprises at least one of cadmium telluride (CdTe), copper indium gallium selenide (CIGS), or copper-zinc-tin-sulfide (CSTS).

19. The method of claim 18, wherein the absorber layer comprises p-doped CdTe.

20. The method of claim 17, further comprising applying a back contact to the absorber layer.

21. The method of claim 20, wherein the back contact comprises at least one of a carbon layer, a gold film, a gold foil, Cu—Au, or Ni—Al.

22. A method comprising:
injecting, into an atmospheric chemical vapor deposition (CVD) deposition chamber that contains a glass substrate coated with a transparent conductive oxide (TCO) layer comprising at least one of $SnO_2$ or $SnO_2$:F, a host oxide precursor comprising at least one of dimethyltin chloride (DMTC), monobutyltin trichloride (MBTC), $C_8H_{18}Cl_2Sn$ (DBTC), $[CH_3(CH_2)_3]_3$ SnCl (TBTC), tetramethyltin, N,N'-Di-t-butyl-2,3-diamidobutanetin(II), Tetrakis(dimethylamino)tin(IV), Tin(IV) t-butoxide, Tin(II) acetylacetonate, or Tin(II) hexaflouroacetylacetonate;
injecting, into the atmospheric CVD deposition chamber, an additive oxide precursor comprising at least one of Tetrakis(diethylamino)zirconium, Zirconium(IV) t-butoxide, Zirconium(IV) ethoxide, Tetrakis(2,2,6,6-tetramethyl-3,5-heptanedionato)zirconium, Zirconium(IV) hexafluoroacetylacetonate, Zirconium(IV) trifluoroacetylacetonate, Bis(cyclopentadienyl)dimethylzirconium, or Dimethylbis(t-butylcyclopentadienyl)zirconium;
injecting, into the atmospheric CVD deposition chamber, an oxidizer comprising at least one of oxygen or water; and
forming an alloyed thin film buffer layer on the TCO layer by reacting the host oxide precursor to form $SnO_2$ and reacting the additive oxide precursor to form ZrO,
wherein the alloyed thin film buffer layer comprises Sn—Zr—O,
wherein a molar ratio of additive oxide to host oxide in the alloyed thin film buffer layer is between about 0.2 and about 0.7, and
wherein the alloyed thin film buffer layer has a concentration of at least one of chlorine or fluorine between about 0.5 mol % and about 2.0 mol %.

* * * * *